United States Patent
Stanley

(10) Patent No.: US 7,969,126 B2
(45) Date of Patent: Jun. 28, 2011

(54) AMPLIFIER EMPLOYING INTERLEAVED SIGNALS FOR PWM RIPPLE SUPPRESSION

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 144 days.

(21) Appl. No.: 12/573,701

(22) Filed: Oct. 5, 2009

(65) Prior Publication Data

US 2010/0019847 A1  Jan. 28, 2010

Related U.S. Application Data

(62) Division of application No. 11/485,612, filed on Jul. 12, 2006, now Pat. No. 7,598,714.

(51) Int. Cl.
  *G05F 1/40* (2006.01)
  *G05F 1/44* (2006.01)
  *G05F 1/56* (2006.01)
(52) U.S. Cl. ......... 323/222; 323/282; 323/283; 323/284
(58) Field of Classification Search .................. None
  See application file for complete search history.

(56) References Cited

U.S. PATENT DOCUMENTS

| | | | |
|---|---|---|---|
| 3,715,649 A | 2/1973 | Ravas | 321/45 R |
| 4,371,840 A | 2/1983 | Yokoyama | 330/10 |
| 4,843,534 A | 6/1989 | Taddeo et al. | 363/71 |
| 5,657,219 A | 8/1997 | Stanley | 363/132 |
| 6,300,825 B1 | 10/2001 | Dijkmans et al. | 330/10 |
| 6,373,334 B1 | 4/2002 | Melanson | 330/10 |
| 6,449,174 B1 | 9/2002 | Elbanhawy | 363/65 |
| 6,496,060 B2 | 12/2002 | Takita | 330/10 |
| 6,504,348 B2 | 1/2003 | Stanley | 323/280 |
| 6,683,494 B2 | 1/2004 | Stanley | 330/10 |
| 6,693,571 B2 | 2/2004 | Melanson et al. | 341/143 |
| 6,707,337 B2 | 3/2004 | Noro | 330/10 |
| 6,768,779 B1 | 7/2004 | Nielsen | 375/297 |
| 6,930,483 B2 | 8/2005 | Sabate et al. | 324/322 |
| 6,949,915 B2 | 9/2005 | Stanley | 323/207 |
| 7,075,346 B1 | 7/2006 | Hariman et al. | 327/116 |
| 7,598,714 B2 | 10/2009 | Stanley | 323/222 |
| 2002/0044458 A1 | 4/2002 | Elbanhawy | 363/15 |

(Continued)

OTHER PUBLICATIONS

Gerald R. Stanley, et al.: "Precision DC-to-AC Power Conversion by Optimization of the Output Current Waveform—The Half Bridge Revisited" *IEEE Transactions on Power Electronics*, vol. 14, No. 2, Mar. 1999, pp. 372-380, XP-011043289.

(Continued)

*Primary Examiner* — Bao Q Vu
(74) *Attorney, Agent, or Firm* — Brinks Hofer Gilson & Lione

(57) ABSTRACT

An amplifier having improved distortion characteristics is set forth. The amplifier includes an interleaved PWM amplifier that generates interleaved PWM pulses in response to a modified input signal and one or more carrier signals. The interleaved PWM pulses of the amplifier are used to drive a power stage, such as an opposed current power stage. The amplifier also includes an interleaved PWM generator that provides interleaved PWM pulses in response to the modified input signal and one or more further carrier signals. The carrier signals used by the PWM generator may differ in phase from the carrier signals used by the interleaved PWM amplifier to generate its interleaved PWM pulses. One or more feedback circuits are employed in the generation of the modified input signal. More particularly, the feedback circuit(s) generates the modified input signal based on an input signal that is to be amplified and the interleaved PWM pulses of the interleaved PWM generator.

27 Claims, 10 Drawing Sheets

U.S. PATENT DOCUMENTS

| | | | |
|---|---|---|---|
| 2002/0167354 A1 | 11/2002 | Stanley | 330/10 |
| 2003/0095013 A1 | 5/2003 | Melanson et al. | 332/109 |
| 2004/0047477 A1 | 3/2004 | Bank et al. | 381/120 |
| 2005/0017695 A1 | 1/2005 | Stanley | 323/207 |
| 2005/0017699 A1 | 1/2005 | Stanley | 323/282 |
| 2006/0125555 A1 | 6/2006 | Watts | 330/10 |
| 2010/0019846 A1 | 1/2010 | Stanley | 330/251 |

OTHER PUBLICATIONS

Estes, F., et al.: "A FPGA-Based Approach to the Digital Control of a Class-D Amplifier for Sound Applications," Power Electronics Specialists, 2005 IEEE 36$^{th}$ Conference on Jun. 12, 2005, pp. 122-126, XP-010883603.

Ertl, Hans, et al., "Analysis of a Multilevel Multicell Switch-Mode Power Amplifier Employing the "Flying-Battery" Concept", *IEEE Transactions on Industrial Electronics*, vol. 49, No. 4, Aug. 2002, pp. 8.

PCT International Search Report and Written Opinion dated Mar. 17, 2008, from corresponding International PCT Application No. PCT/US2007/073150 filed Jul. 10, 2007 (16 pgs.).

U.S. Appl. No. 12/573,674, filed Oct. 5, 2009.

AMPLIFIER EMPLOYING INTERLEAVED SIGNALS FOR PWM RIPPLE SUPPRESSION

This application is a divisional of U.S. patent application Ser. No. 11/485,612 entitled AMPLIFIER EMPLOYING INTERLEAVED SIGNALS FOR PWM RIPPLE SUPPRESSION, filed on Jul. 12, 2006, which is incorporated by reference in its entirety.

BACKGROUND OF THE INVENTION

1. Technical Field

The invention generally relates to amplifiers and, more particularly, to an interleaved amplifier employing interleaved signals for PWM ripple suppression.

2. Related Art

Pulse width modulation (PWM) amplification for audio applications has been used to increase efficiency by incorporating output devices that act as switches as opposed to linear devices that must dissipate a substantial amount of power. In PWM amplifiers, an audio input signal is converted to a pulse width modulated waveform. To this end, an audio signal is provided to the amplifier to modulate the width of an ultrasonic rectangular waveform based, for example, on the amplitude of the audio signal. The modulated waveform is used to drive one or more output devices as switches that are either fully saturated or off. The output devices, often implemented using switching power transistors, may be aligned in half-bridge pairs such that one device of the pair switches a positive voltage to the output, while the other device switches a negative voltage to the output. The switched output signals may be provided to the input of a low-pass filter in an attempt to remove harmonic signals and sidebands that are beyond the spectrum of the desired output waveform. The filtered analog signal is used to drive the load, such as a loudspeaker.

One set of pulse width modulated amplifier architectures, known as class-D amplifiers, are theoretically 100% efficient because the output transistors are either completely on, or completely off. These amplifiers, however, may be problematic since the timing of the switching of the transistors must be precisely controlled. In a class-D amplifier, the switches operate in time alternation. Ideally, the switching is perfectly timed so that one transistor instantaneously turns off as the other instantaneously turns on. If the switching is not perfectly timed, both the positive and negative switching devices may be on at the same time, allowing high "shoot-through" current, which may destroy the circuitry of a subsequent stage in the amplifier system. Therefore, in practice, a delay may be purposely introduced between the time at which one transistor turns off and the other transistor turns on. The time between the conduction intervals of the two switches when neither switch is on is known as deadtime. Deadtime may result in distortion and, therefore, should be minimized. Conversely, an insufficient amount of that time may result in undesired shoot-through current.

An amplifier addressing the shoot-through current and deadtime issues is available from Crown Audio International of Elkhart, Ind. The amplifier architectures used in certain of the Crown Audio amplifiers are known by various names including opposed current amplifiers, a balanced current amplifiers (BCA®), and "I-class" amplifiers. In this amplifier architecture, the positive and negative switching pulses corresponding to the modulated waveform are time interleaved with one another. When the audio input signal is at a zero-crossing, i.e. where no signal is to be provided at the amplifier output, the interleaved pulses turn the switches on and off in an overlapping manner at a 50% duty cycle. As a result the positive and negative power sources through-connected by the switches cancel each other out to provide a null output signal. When the incoming signal that is to be amplified exceeds the zero crossing and enters a positive voltage state, the duty cycle of the interleaved pulses are such that the duty cycle of the switch through-connecting the positive power source increases. When the incoming signal falls below the zero-crossing and goes to a negative state, the converse occurs.

Although the opposed current amplifier architecture provides a significant improvement over conventional PWM amplifiers, the architecture may be the subject of improvements. For example, as will be set forth in further detail below, the distortion results of an amplification system using multiple opposed current amplifiers that are interleaved with one another may be improved through the use of intelligently designed feedback systems.

SUMMARY

An amplifier having improved distortion characteristics is set forth. The amplifier includes an interleaved PWM amplifier that generates interleaved PWM pulses in response to a modified input signal and one or more carrier signals. The interleaved PWM pulses of the amplifier are used to drive a power stage, such as an opposed current power stage. The amplifier also includes an interleaved PWM generator that provides interleaved PWM pulses in response to the modified input signal and one or more further carrier signals. The carrier signals used by the PWM generator may differ in phase from the carrier signals used by the interleaved PWM amplifier to generate its interleaved PWM pulses. One or more feedback circuits are employed in the generation of the modified input signal. More particularly, the feedback circuit(s) generates the modified input signal based on an input signal that is to be amplified and the interleaved PWM pulses of the interleaved PWM generator.

Multiple feedback circuits may be employed. To this end, a first feedback circuit may be implemented to feedback an output of the power stage of the interleaved amplifier to generate a first feedback signal, while a second feedback circuit may be implemented to feedback the interleaved PWM pulses of the PWM generator to generate a second feedback signal. A combiner circuit may be used to combine the input signal, the first feedback signal, and the second feedback signal to generate the modified input signal.

The signal transfer characteristics of various amplifier sections may be manipulated to meet the desired degree of distortion reduction. For example, the interleaved PWM amplifier and the first feedback circuit may combine to exhibit a first signal transfer characteristic, while the interleaved PWM generator and the second feedback circuit may combine to exhibit a second signal transfer characteristic. The first and second transfer characteristics may be selected so that they are proportional to one another in about the same ratio as $N_L$ to $N_N$ over at least a predetermined portion of an output bandwidth of the amplifier, where $N_L$ is the interleave order of the interleaved PWM generator and $N_N$ is the interleave order of the interleaved PWM amplifier. In some amplifier implementations, the interleaved PWM amplifier may have an interleave order of one (non-interleaved).

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
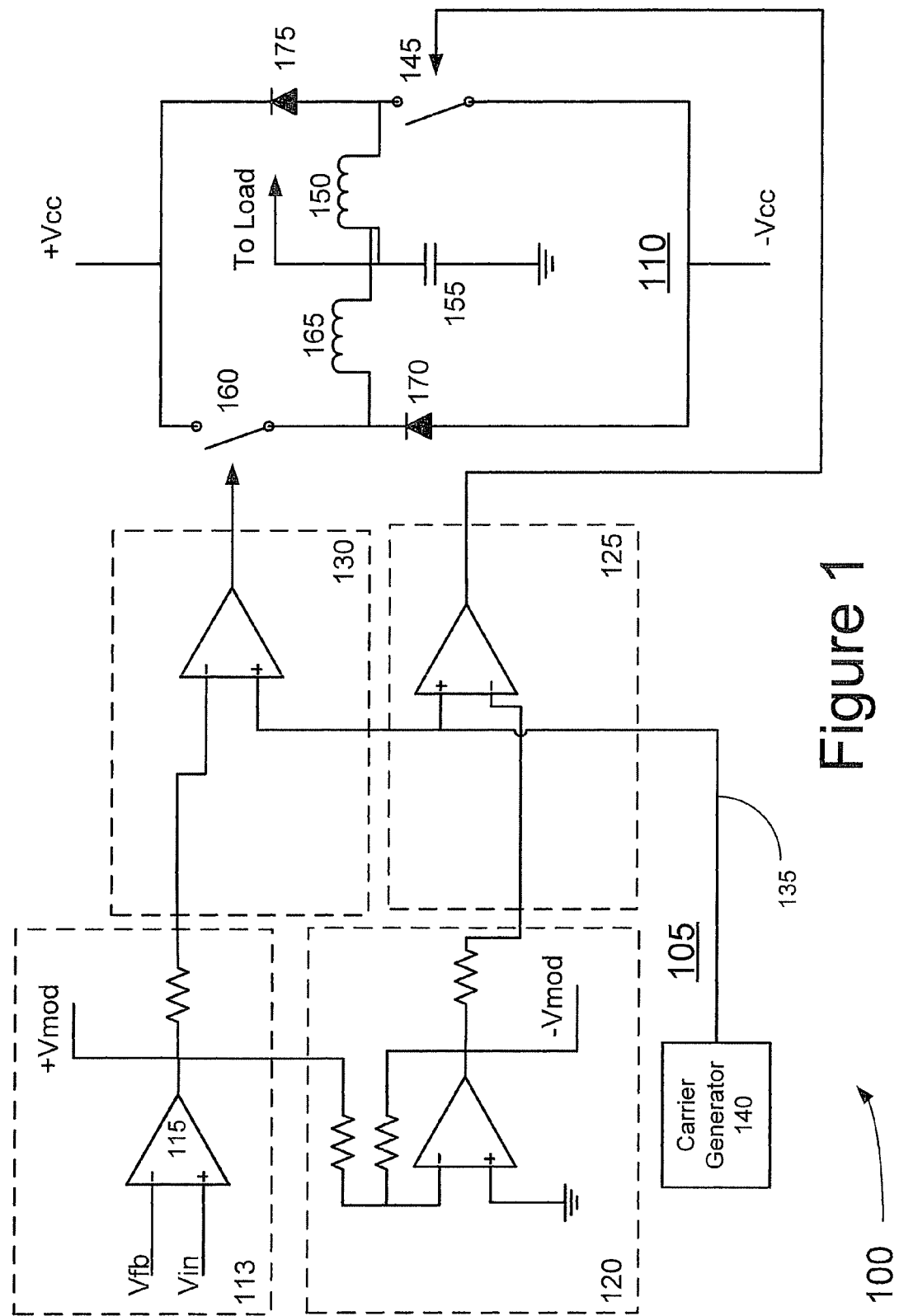
FIG. 1 is a schematic block diagram of one example of an interleaved amplifier that may be used to implement the amplifier systems shown in FIGS. 3 through 5.

In order to comprehend the exemplary interleaved amplifier system set forth below, an understanding of the output signal spectrum of a more conventional PWM amplifier may be useful. More particularly, the output signal spectrum of a natural double-sided PWM process may be represented as:

$$y_0(t) = MV_0\cos(\omega_s t) + \left(\frac{4V_0}{\pi}\right)\sum_{m=1}^{\infty}\frac{1}{m} \left[\sum_{n=-\infty}^{\infty} J_n\left(\frac{Mm\pi}{2}\right)\sin\left(\frac{(m+n)\pi}{2}\right)\cos(m\omega_c t + n\omega_s t)\right]$$

(Equation 1)

M is the modulation index where $0 \leq M \leq 1.0$
$\omega_s$ is the signal frequency in radians/second
$\omega_c$ is the PWM carrier/switching frequency in radians/second
$V_o$ is the peak output voltage of the PWM waveform
m is the integer harmonic order number of the carrier band $1 \leq m \leq \infty$
n is the sideband order number $-\infty \leq n \leq \infty$ The leading cosine term is the intended signal for a process whose input is a cosine of radian frequency $\omega_s$ and whose amplitude relative to the modulating triangular waveform is of proportion M. The triangle waveform is given in unity amplitude cosine form as:

$$\overline{v(t)} = \frac{8}{\pi^2}\sum_{m=1,3,5...}^{\infty}\frac{1}{m^2}\cos(m\omega_c t)$$

(Equation 2)

The second part of (Equation 1) is composed of harmonics (m) of the modulating triangle and sideband pairs (±n) about each harmonic. The amplitude of each sideband is given by a Bessel function $J_n$ of the first kind (order n), a function of the modulation index M, and harmonic order m. Since m and n are always integers, the product sine term has three possible values, −1, 0 and +1. When m+n is even, the sine term is zero and there is no sideband. Similarly, there is ideally no carrier when n=0. In other words, even harmonics have only sidebands that are spaced by odd multiples of the signal frequency, and odd harmonics have only even multiples of the signal frequency including a carrier harmonic.

In a conventional PWM amplifier, the feedback of a sideband whose n=1 produces a gain error and not a distortion. Terms where n=0 and where m is odd create DC offset errors. These signals result in harmonic distortion when they produce intermodulation signals that lie within the signal passband of the amplifier. For an audio amplifier, that signal passband may be less than or equal to about 20 KHz, but may often be as high as 40 KHz in high end audio systems. Signals that lie outside the frequency passband may be measured and used as an indicator of amplifier performance.

One manner of reducing undesired signals in the frequency spectrum of a PWM amplifier output signal is to use a power stage that is switched using interleaved PWM pulses. When implemented using natural double-sided PWM, such interleaving may result in considerable suppression of undesired signals over an extensive range of harmonic orders. Further, such interleaving may result in considerable suppression of sidebands for bands that are not modulo the interleave number N of the amplifier.

An exemplary opposed current amplifier that may be used to implement an interleaved amplifier system is shown generally at 100 of FIG. 1. The illustrated system includes a pulse width modulator section 105 and an opposed current drive section 110. The pulse width modulator section 105 includes an input section 113 including an error amplifier 115. Error amplifier 115 receives the audio signal that is to be amplified Vin as well as a feedback signal Vfb. The feedback signal Vfb is subtracted from the audio signal Vin by the error amplifier 115 to generate a modified input signal +Vmod at its output. This output is provided to the input of an inverter circuit 120, which generates an output signal −Vmod that is approximately 180 degrees out of phase with +Vmod.

Signals +Vmod and −Vmod are provided to the input of a positive pulse modulator circuit 130 and negative pulse modulator circuit 125, respectively. Both modulator circuits 130 and 125 modulate their respective input signals +Vmod and −Vmod with a carrier signal that is provided at one or more lines 135 by a carrier generator 140. When the system 100 is used for audio amplification, the carrier signal may be implemented as an ultrasonic frequency triangle wave. It also may be possible to use other carrier signal types, depending on the particular application.

The output of positive pulse modulator 130 is provided as an input to the opposed current drive section 110 to control the state of switch device 160. As shown, switch device 160 is used to through-connect a positive voltage +Vcc to a load through a low-pass filter when in the conductive state. The low-pass filter in this example is comprised of inductor 165 and capacitor 155. Similarly, the output of negative pulse modulator 125 is provided as an input to the opposed current drive section 110 to control the state of switch device 145. As shown, switch device 145 is used to through-connect a negative voltage −Vcc to the load through a further low-pass filter when in the conductive state. The further low-pass filter in this example is comprised of inductor 150 and capacitor 155. Inductors 150 and 165 may both have the same inductance value and characteristics. Switch devices 145 and 160 may be implemented, for example, using one or more of a variety of different switching transistor technologies. Diodes 170 and 175 function as freewheel diodes during the switching operations.

Figure 2:
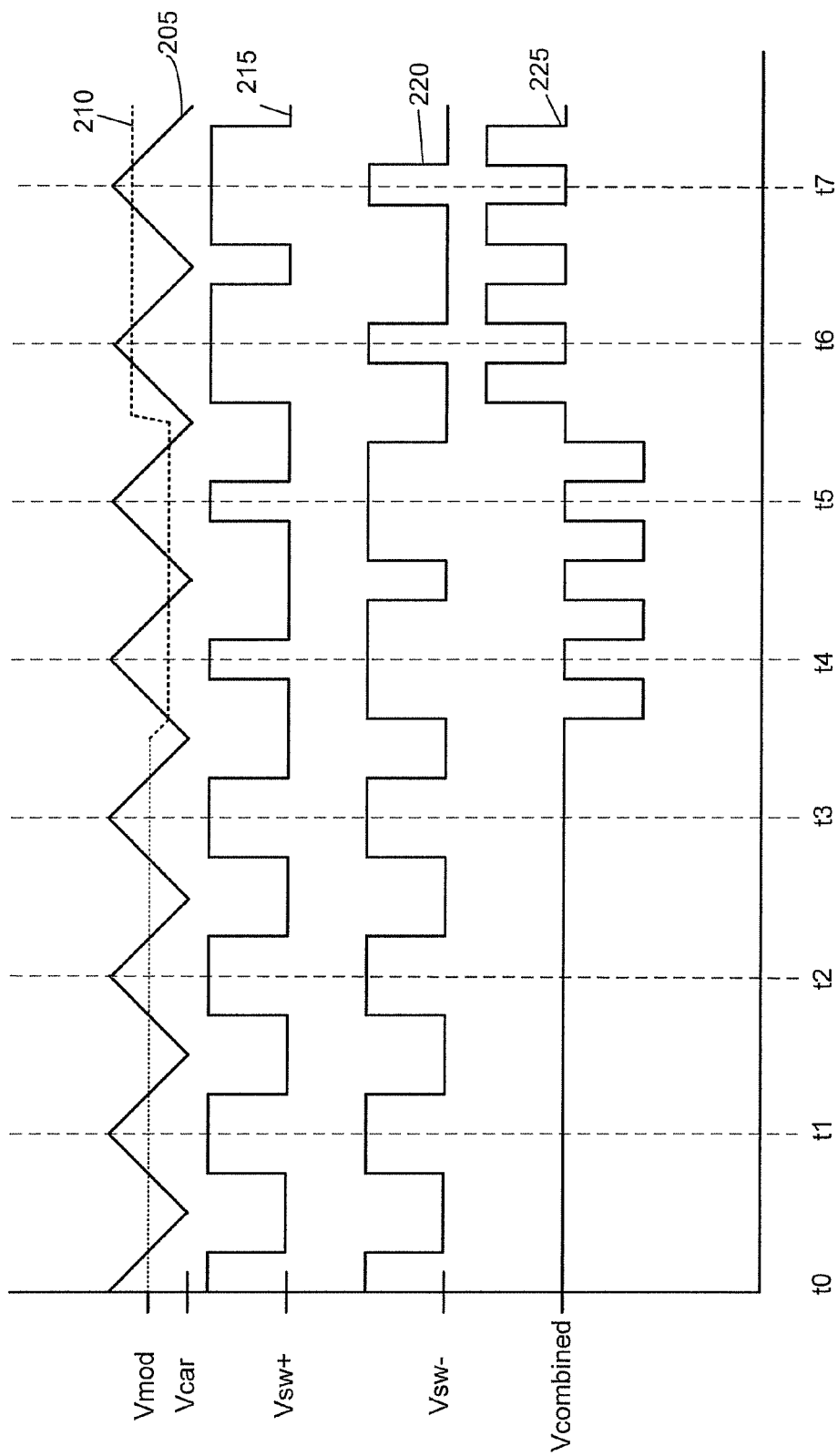
FIG. 2 is a signal diagram illustrating the operation of the interleaved amplifier shown in FIG. 1.

FIG. 2 illustrates the relationship between different waveforms that are generated in the opposed current amplifier shown in FIG. 1. In this example, a single triangular carrier waveform 205 (Vcar) is shown centered at 0V, and the modified input signal +Vmod is shown as a dotted line at 210. The pulse signals provided to the switches 160, 145 are illustrated by waveforms 215 and 220, respectively. Pulse signals 215 and 220 are provided to the drive circuit in a manner that generates a switched power voltage, shown here at 225 (Vcombined), that, for example, may be filtered, processed, or the like, for provision to a load.

For illustration purposes, the modified input voltage 210 is shown at a relative level of 0V from periods t0 through t3 of FIG. 2. During this time, signals 215 and 220 have the same amplitude and duration. As a result, the switched power voltage 225 remains at 0V. However, the modified input signal 205 transitions to a voltage below 0V between times t3 and t4, where it remains until time t5. This change in the voltage level of the modified input signal 205 causes a corresponding change in the duty cycles of the pulse signals 215 and 220 that, in turn, results in the generation of the negative going pulses illustrated in waveform 225. Similarly, the modified input signal 205 transitions to a voltage above 0V between times t5 and t6, where it remains through time t7. This change in the voltage level of the modified input signal 205 likewise causes a corresponding change in the duty cycles of the pulse signals 215 and 220. In this latter instance, the duty cycle change results in the generation of the positive going pulses illustrated in waveform 225.

The output spectrum of such an interleaved PWM amplifier is given by:

$$y_0(t) = MV_0\cos(\omega_s t) + \left(\frac{4V_0}{\pi}\right)\sum_{p=1}^{\infty}\frac{1}{pN}$$

$$\left[\sum_{n=-\infty}^{\infty} J_n\left(\frac{MpN\pi}{2}\right)\sin\left(\frac{(pN+n)\pi}{2}\right)\cos(pN\omega_c t + n\omega_s t)\right]$$

(Equation 3)

where:
N is the integer interleave order $1 \leq N \leq \infty$; and
pN is the integer harmonic number and $1 \leq p \leq \infty$.

When N=1 the above expression is identical to (Equation 1) as expected. Wherever m had appeared in (Equation 1), now pN appears and reveals that the interleave architecture has ideally suppressed all bands of order m that were not modulo N. Those bands (m) that remain as integer (p) multiples of N ideally have identical sideband and carrier harmonics as in (Equation 1).

The foregoing interleaved amplifier analysis reveals that interleaved PWM amplifiers have self-filtering characteristics that render the amplifier capable of selectively removing entire bands of PWM spectrum from the signal path. Increasing the order of interleave N of the amplifier results in a corresponding decrease in the amplitude and increase in the frequency of the PWM spectral remnants in the switched power output signal provided from the switched power stage. These low amplitude, high frequency spectral remnants may be easily filtered from the switched power signal to generate an intended output signal to the load, where the intended output signal constitutes a faithfully amplified version of the amplifier input signal with limited distortion. Further reductions in the corruption of the intended output signal caused by PWM spectral remnants can be achieved using interleaved PWM pulses to enhance the filtering of low power signals that are corrupted with the PWM spectrum. This manner of enhancing the filtering of the low-power signals may be combined, for example, with one or more feedback methods.

Figure 3:
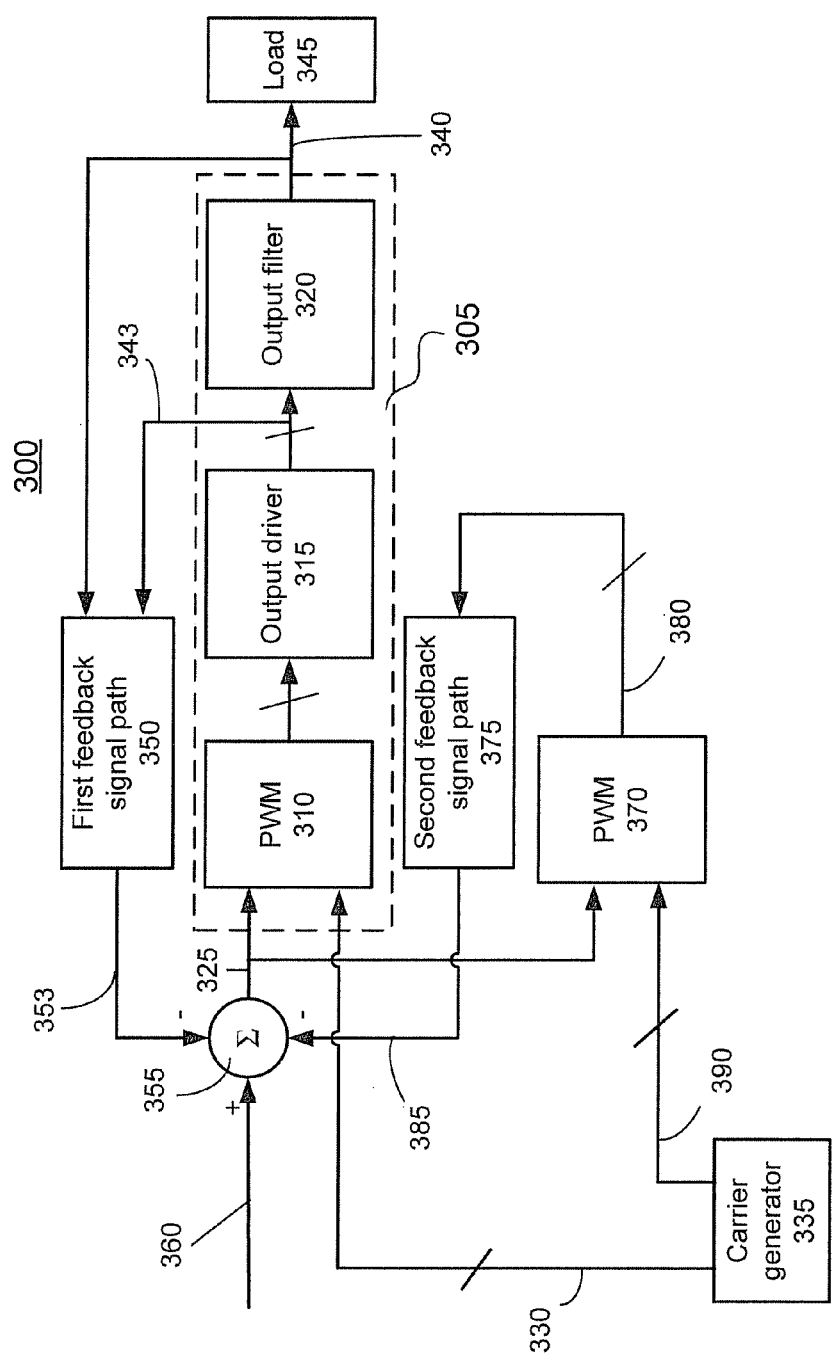
FIG. 3 is a block diagram of one example of an amplifier employing an interleaved PWM feedback signal that is generated from a carrier that differs in phase from the carrier used to generate the PWM drive signals provided to the power stage of the amplifier.

One example of an amplifier 300 that employs interleaved PWM pulses to enhance the filtering of low power feedback signals that otherwise may be corrupted with the spectrum of the modulating PWM carrier signal(s) is shown in FIG. 3. In this example, amplifier 300 includes an interleaved PWM amplifier 305 that, in turn, may include pulse width modulator 310, output driver 315, and output filter 320. Pulse width modulator 310 generates interleaved PWM pulses to the output driver 315 based on a modified input signal 325 and one or more carrier signals 330 provided by carrier generator 335. The interleaved PWM pulses may be generated in the manner shown in FIG. 1, which may be expanded to an interleave order $N_N$ based, at least in part, on the number of carrier signals 330 that are modulated by the modified input signal 325. Carrier signals 330 may be in the form of multiple triangular waveforms having different phases but the same amplitude. The phases of the carrier signals 330 may be chosen so that their corresponding signal vectors equally divide a unit circle.

Output driver 315 may include one or more switching power stages of the type shown in FIG. 1. As in FIG. 1, the interleaved PWM pulses provided by the PWM modulator are used to turn the power switching devices, such as switching transistors and the like, on and off. The resulting switched power output from output driver 315 may be provided to the input of output filter 320. Output filter 320 may include one or more filters to remove signals beyond the desired passband of the amplifier 300 before the intended signal 340 is provided to load 345. Any components that may be needed to combine multiple switched power signals of output driver 315 with one another for provision to load 345 also may be included in output filter 320.

Although the interleaved architecture of interleaved PWM amplifier 305 endows amplifier 300 with self-filtering characteristics that are inherent to the interleaved architecture, further measures are also employed in amplifier 300 to reduce unwanted harmonics, sidebands, and the like in the intended output signal 340. For example, negative feedback of the intended output signal 340 and/or the signal 343 from the output of the PWM output driver 315 may be used to correct non-linear and/or stochastic imperfections present in less than ideal realizations of the amplifier 300. Such imperfections naturally occur when the amplifier 300 is implemented with actual components, and may be contrasted with the idealized representations of those components often used in theoretical circuit analyses.

In the illustrated example, negative feedback is accomplished by directing the intended output signal 340 and/or the signal 343 from the output of the PWM output driver 315 through a feedback signal path 350 to generate one or more negative feedback signals 353 at the input of a combiner circuit 355. The intended output signal 340 and/or the signal 343 from the output of the PWM output driver 315 may be processed by components in the feedback signal path 350 to generate feedback signal 353 in one or more of a variety of different manners. For example, the intended output signal 340 and/or the signal 343 from the output of the PWM output driver 315 may be filtered, time delayed, phase delayed, scaled, or the like by the components of path 350. The combiner circuit 355 shown in FIG. 3 subtracts feedback signal 353 from an input signal 360 to complete pursuant to the negative feedback operation. The input signal 360 may constitute a signal that is directly provided to amplifier 300 for amplification or, alternatively, may constitute a processed signal that corresponds to the signal directly provided to amplifier 300 for amplification.

As noted above, amplifier 300 also employs interleaved PWM pulses to enhance the filtering of low power signals that otherwise may be corrupted with the spectrum of the modulating PWM carrier signal(s) used by pulse width modulator 310. In the example shown in FIG. 3, an interleaved PWM generator 370 provides interleaved PWM pulses 380 to the input of another feedback signal path 375. Feedback signal path 375, in turn, provides one or more further feedback signals 385 to the input of combiner circuit 355, where the signal(s) is subtracted from the input signal 360 and negative feedback signal 353 to generate the modified input signal 325. The interleaved pulses 380 may be processed by components in the feedback signal path 375 to generate feedback signal 385 in one or more of a variety of different manners. For example, the interleaved pulses may be filtered, time delayed, phase delayed, scaled, or the like by the components of path 375.

Pulse width modulator 370 generates interleaved PWM pulses 380 to feedback signal path 375 based on the modified input signal 325 and one or more carrier signals 390 provided by carrier generator 335. The interleaved PWM pulses may be generated in the manner shown in FIG. 1, which may be expanded to an interleave order $N_L$ based, at least in part, on the number of carrier signals 390 that are modulated by the modified input signal 325. Carrier signals 390 may be in the form of multiple triangular waveforms having different phases but the same amplitude. Further, carrier signals 390 may differ in phase from carrier signals 330. The phases of the carrier signals 330 and 390 may be chosen so that their corresponding signal vectors equally divide a unit circle.

Figure 4:
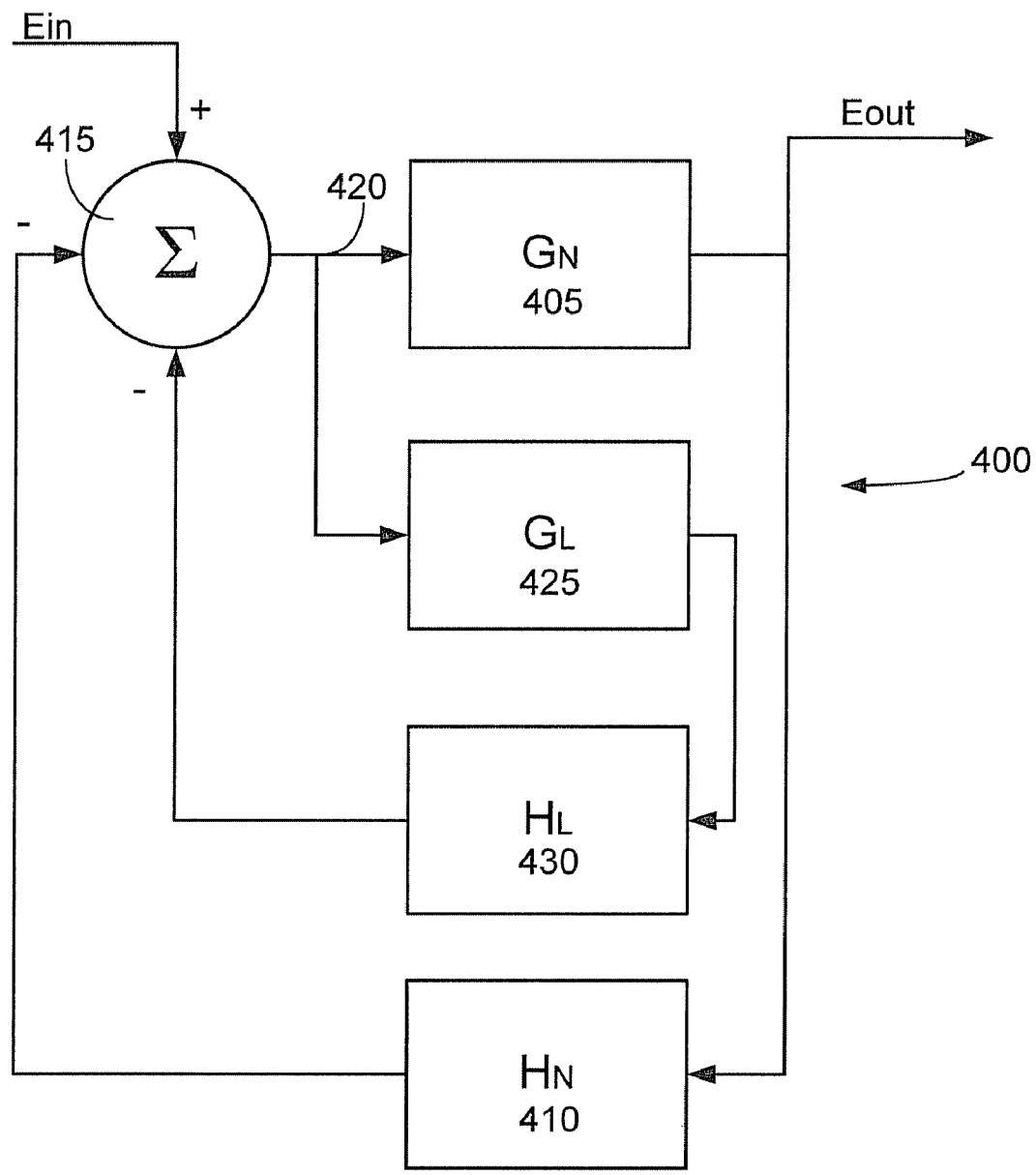
FIG. 4 is a block diagram of a further example of an amplifier system employing an interleaved PWM feedback signal that is generated from a carrier that differs in phase from the carrier used to generate the PWM drive signals provided to the power stage of the amplifier.

FIG. 4 is a signal flow diagram illustrating exemplary transfer characteristics of amplifier 300. In this example, amplifier system 400 receives an input signal Ein and generates an amplified output signal Eout. In the case of a power amplifier, the output signal Eout would deliver energy to a load, such as a loudspeaker. There also may be additional filtering between the output signal Eout and the ultimate load.

Block 405 represents an interleaved PWM amplifier having a signal transfer characteristic $G_N$. The interleaved PWM amplifier represented by block 405 may have some non-linear and/or stochastic imperfections that are corrected through negative feedback. To this end, the output signal Eout is processed through a feedback block 410, which has a signal transfer characteristic $H_N$. The output of the feedback block 410 is provided to the input of a signal combiner 415, where it is subtracted from the input signal Ein as part of the process used to generate a modified input signal 420 at the output of the signal combiner 415. As shown, block 405 uses the modified input signal 420 to generate output signal Eout.

Block 425 encompasses pulse width modulator 370 of FIG. 3 and has a signal transfer characteristic $G_L$. In this example, block 425 may be a linear, low-noise gain block having its output processed by block 430, where block 430 has a signal transfer characteristic $H_L$. The output of block 430, in turn, is subtracted from the input signal Ein by combiner circuit 415 as part of the process used to generate the modified input signal 420.

The signal transfer characteristic $H_L$ of block 430 may be selected so that $G_L \cdot H_L$ is nominally proportional to $G_N \cdot H_N$ over at least a predetermined portion of the output bandwidth of the amplifier 400. In many instances, this proportionality may be generally maintained over the entire bandwidth for which the amplifier is designed. In choosing signal transfer characteristic $H_L$, the interleave orders of blocks 405 and 425 may be considered. Block 405 is understood to have an interleave order of $N_N$, and block 425 is understood to have an interleave order of $N_L$. Consequently, amplifier 400 has a feedback system interleave order of $N_N+N_L=N_S$. Sideband cancellation properties for an amplifier having a system interleave order of $N_S$ are enhanced when the proportionality of $G_N \cdot H_N$ to $G_L \cdot H_L$ is approximately equal to the proportionality of $N_N$ to $N_L$. Signal transfer characteristic $H_L$ therefore may be selected in accordance with this attribute.

Realizing the desired proportionality between $G_N \cdot H_N$ and $G_L \cdot H_L$ also may entail adding a delay to the output of block 425 or block 430. This added delay may be used to compensate for the inherent delay associated with driving the switches in the power stage(s) of block 405. Alternatively, or in addition, delay compensation may be included in one or both of blocks 425 and 430.

It is possible that $N_N=1$. In such instances, block 405 is not interleaved and the only interleave order provided in the system is by block 425, where $N_L>0$. With reference to amplifier 300 shown in FIG. 3, such a system may be constructed merely by replacing interleaved PWM amplifier 305 with a standard, non-interleaved PWM amplifier. Notwithstanding this substitution, sideband and harmonic signal reductions are realized when feedback of the interleaved pulses 380 through signal path 375 is employed.

From a feedback interleave perspective, it does not matter which phasing vectors represent the carrier signals modulated in blocks 405 and 425 as long as the $N_S$ vectors evenly divide the unit circle and have amplitudes that are substantially equal. In one implementation, the phasing vectors used in block 405 evenly divide the unit circle, and the phasing vectors of block 425 evenly divide the angles between the phasing vectors of block 405. Using such a phasing vector configuration assists in minimizing noise induced errors in the modulators driving the power stages of block 405.

Each of the blocks 405 and 425 may be elaborated by expanding their level of detail to show the interleaved structure present in each. In some instances, the interleaved structure in one or both blocks 405 and 425 may be implemented through the use of parallel systems. However, the interleaved structure(s) also may be implemented from series interleaved elements. For example, a classic full-bridge power converter may be implemented using two half-bridge interleaved amplifiers having their output circuits in series with the load.

An analysis of the amplifier 400 with its corresponding signal transfer characteristics results in the following closed-loop gain equation:

$$\frac{Eout}{Ein} = \frac{G_N}{(1 + G_L H_L + G_N H_N)} \quad \text{(Equation 4)}$$

In this equation, the feedback factor is expressed in the denominator and is dominated by the G·H terms. Since these terms are related to the values of $N_N$ and $N_L$, the feedback factor is diluted as the value of $N_L/(N_L+N_N)$ increases. Consequently, the values of $N_L$ and $N_N$ should be considered when assessing the stability of the feedback system. System stability is best when the value of $N_L$ is not significantly larger than $N_N$. For example, the value of $N_L$ may be selected so that it is twice the value of $N_N$. However, it will be recognized that other relationships between the $N_L$ and $N_N$ values may be employed while still maintaining system stability.

Figure 5:
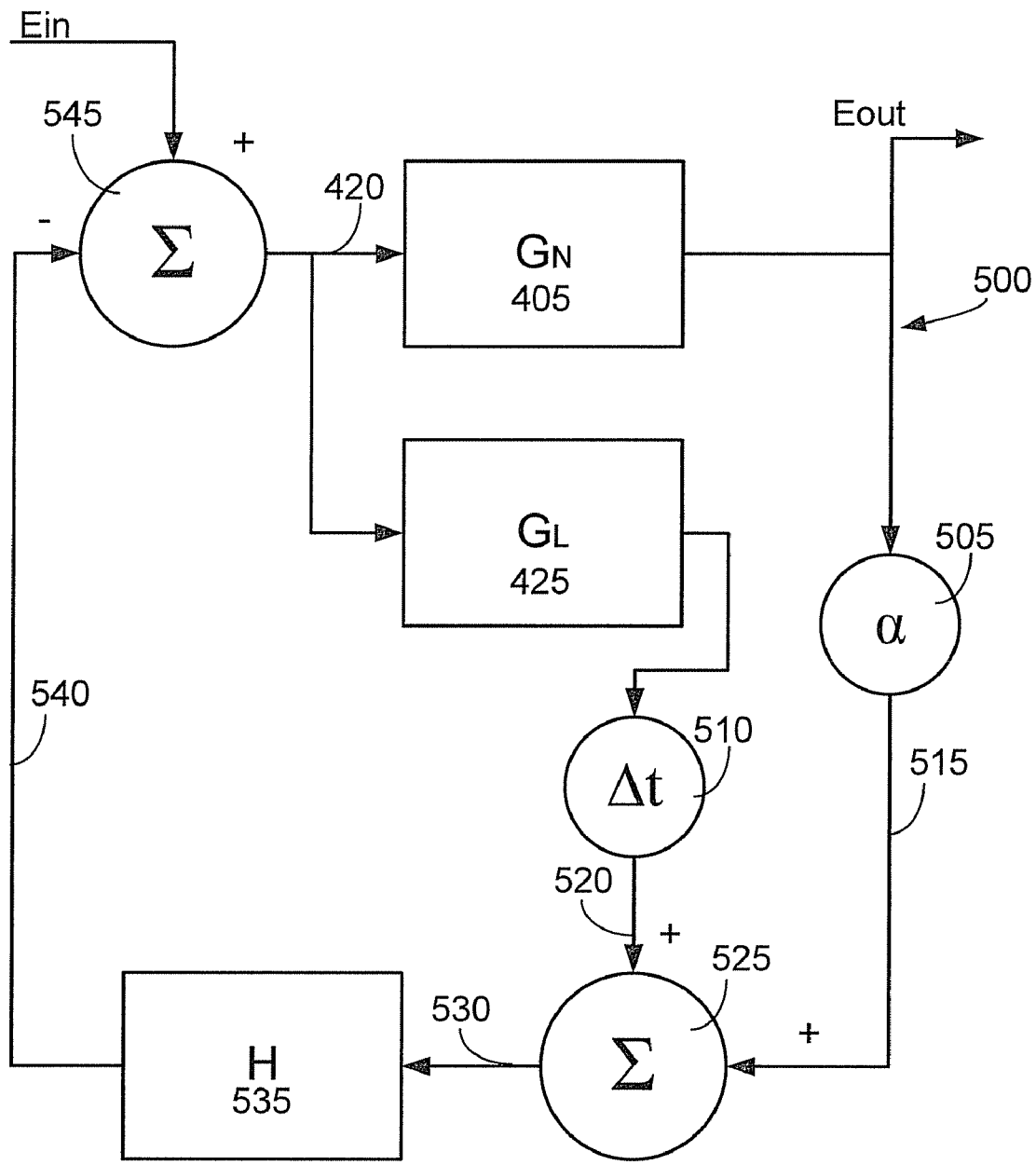
FIG. 5 is a block diagram of a still further example of an amplifier system employing an interleaved PWM feedback signal that is generated from a carrier that differs in phase from the carrier used to generate the PWM drive signals provided to the power stage of the amplifier.

The matching/ratioing of $G_L \cdot H_L$ to $G_N \cdot H_N$ can be approached from the standpoint of sharing as much of signal transfer characteristic $H_L$ as possible with $H_N$ of the negative feedback signal. This approach may be used to reduce the cost and complexity of the feedback architecture shown in FIG. 4. FIG. 5 shows such an approach in a system shown generally at 500. As shown, the output of block 405 is provided to the input of a signal attenuator 505 having a signal transfer characteristic α, and the output of block 425 is provided to the input of a delay circuit 510 having a delay value of Δt. The signal attenuator 505 may be used to compensate for differences in output gain, since the output and gain of signal transfer function $G_N$ will be generally larger than would be expected of signal transfer function $G_L$. The delay circuit 510 provides time compensation between the output signals of blocks 405 and 425 since the power stages employed in block 405 tend to have appreciable propagation delays that may require compensation if the two signal paths are to be matched in the proper ratio. An attenuated signal 515 and delayed signal 520 are added to one another by combiner circuit 525 to generate a feedback signal 530. Block 535 has a signal transfer characteristic H and represents optional and/or unintentional signal processing/distortions to which the feedback signal 530 may be subjected. The output of block 535 is a primary feedback signal 540 that is combined with input signal Ein by combiner circuit 545 to generate the modified input signal 420. In the system 500, the desired $N_N$ to $N_L$ ratio can be achieved by adjusting the parameters within α, $G_N$ and $G_L$.

The system 500 shown in FIG. 5 may be employed in a multichannel amplifier where the modulation waveforms for higher order interleave may already exist. For example, in a two channel amplifier that already has an interleave of two in each channel, the second channel may have a modulating waveform that is formed in time quadrature with the modulating waveform used by first channel to result in a sum-of-channels output bridging that has an interleave of four. In this situation, the PWM modulator for block 425 need only employ two comparators and may be provided with the same main signal inputs as the comparators used in the modulator(s) of block 405. Once delay has been added to the comparator outputs of block 425, these output signals are already in a state in which they are ready to be combined with the attenuated version of the signal from the main output.

Depending on design criterion, the signal transfer function $G_L$ may be treated as entirely linear except for an idealized PWM modulation process. However, it also may be desirable to intentionally add some non-linearity to $G_L$ to help correct for non-linearities of signal transfer function $G_N$. When the form of error is identical for both signal transfer functions, then there is no dilution of the effective feedback factor that results from this technique as regards distortion correction. If the distortion in $G_L$ is overstated, then it is possible for some localized distortion nulling to occur in the output. In such a system, the distortion exhibited by signal transfer characteristic $G_L$ may naturally resemble some of the distortion exhibited by signal transfer characteristic $G_N$ since the mechanisms that create propagation delays also introduce some of the distortions that are common to both. Therefore, if either or both block 425 and/or delay circuit 510 are designed to include some of the same propagation distortion characteristics as generated in block 405, like distortions will be found on signals 515 and 520. Ultimately, these distortions will be used to generate modified input signal 420 and, in turn, result in a reduction of the effects of propagation delay distortions on the output signal Eout.

Figure 6:
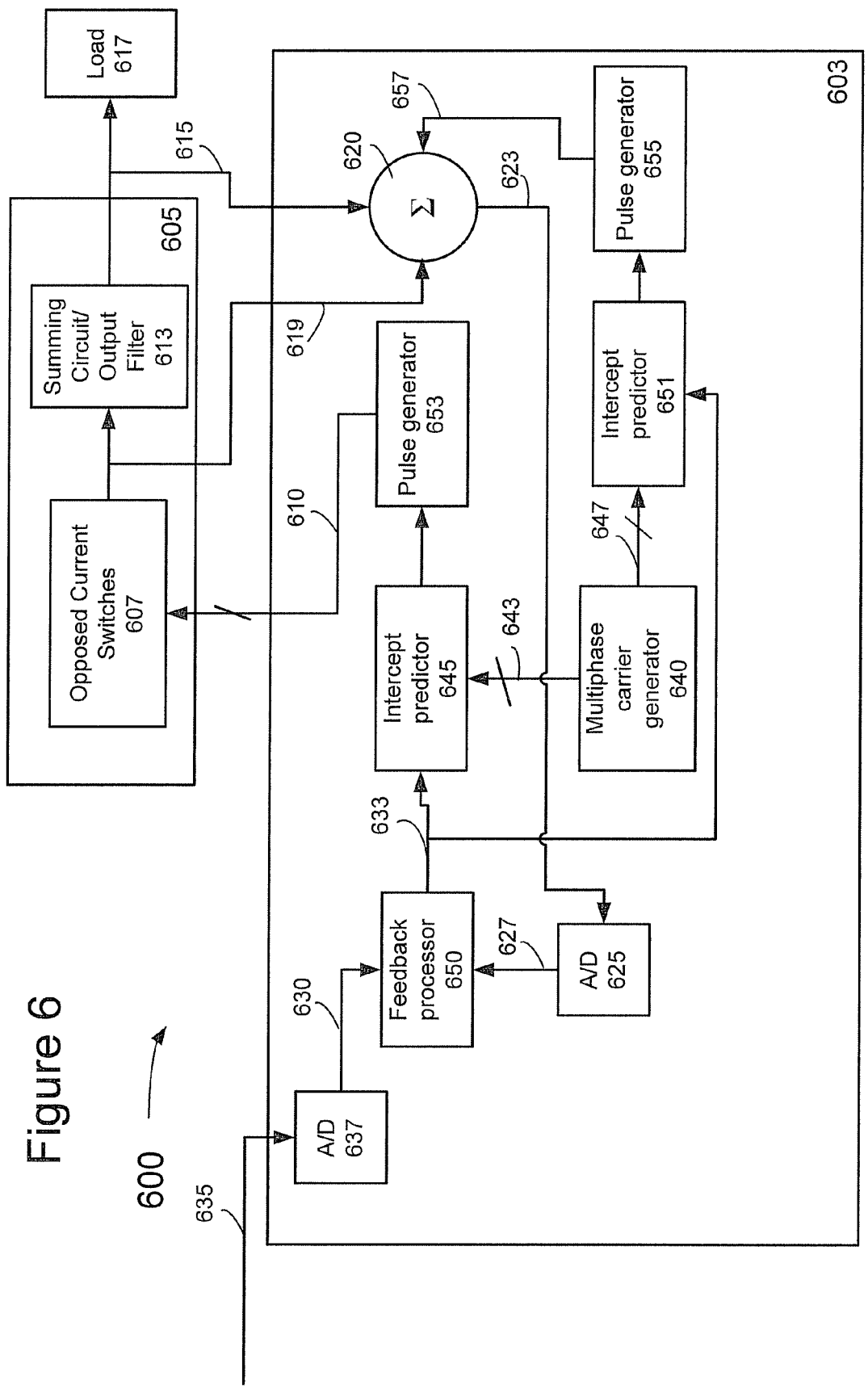
FIG. 6 is a block diagram of a still further example of an amplifier system employing an interleaved PWM feedback signal, where the desired characteristics of the feedback signal may be determined by the characteristics of an attenuator circuit and a delay circuit.

The foregoing systems may be implemented in the analog domain, the digital domain, or a combination of both. FIG. 6 illustrates one manner in which such systems may be implemented in a combined domain. As shown, amplifier system 600 includes a modulator section 603 and a switched power section 605. Switched power section 605 includes an opposed current switching circuit 607 that is responsive to PWM pulse drive signals 610 provided from the modulator section 603. The output of the opposed current switching circuit 607 may be provided to a summing circuit/output filter 613 that, in turn, provides the intended output signal 615 to a load 617. The intended output signal 615 may be used for negative feedback by providing it to the input of a combiner circuit 620 of the modulator section 603. Alternatively, or in addition, the drive signals provided at the output of the opposed current switches may be provided to the input of the combiner circuit 620 along lines 619 for use in providing negative feedback. The combiner circuit 620 also accepts the signals at one or more lines 657. The output of the combiner circuit 620 is provided at one or more lines 623, which, in turn, is provided to the input of an analog-to-digital converter 625. Prior to its provision to the analog-to-digital converter 625, the signal(s) 623 may be scaled, filtered, or otherwise processed in the analog domain so that further feedback processing in the digital domain may be simplified, if desired.

The analog-to-digital converter 625 provides output signals at one or more lines 627 that correspond to the signals 623. These output signals are digitally processed by a feedback processor 650 along with digital signals 630 to generate a modified input signal 633. Digital signal 630 corresponds to an analog signal input 635 that has been converted to a digital format by analog-to-digital converter 637. Input signal 635 may constitute a signal that is directly provided to amplifier 600 for amplification or, alternatively, may constitute a processed signal that corresponds to the signal directly provided to amplifier 600 for amplification.

Modulator section 603 includes a multiphase carrier generator 640 that generates digital representations of the various carrier signals that are PWM modulated using the modified input signal 633. In the illustrated system, a digital representation 643 of a first set of one or more analog carrier signals is provided to the input of intercept predictor 645. A digital representation 647 of a second set of one or more analog carrier signals is provided to the input of intercept predictor 651. The digitized carrier signals 643 and 647 may correspond to triangular modulator signals. The analog carrier signals represented by digitized carrier signals 643 differ in phase from the analog carrier signals represented by digitized carrier signals 647. In the illustrated implementation, the analog carrier signals represented by digitized carrier signals 643 may have phase vectors that evenly divide a unit circle. Similarly, the analog carrier signals represented by digitized carrier signals 647 may be selected so that they evenly divide a unit circle at angles between the phase vectors corresponding to the analog signals represented by digitized carrier signals 643.

The modified input signal 633 may be compared with the digitized carrier signals 643 by the intercept predictor 645 to determine where signals 633 and digitized carrier signals 643 will intercept one another. It is possible to use multiple input data samples on both sides in time of the expected time intercept point to compute a point of intercept. The determination of the intercept points can be calculated using interpolation/root-finding software implemented in, for example, a digital signal processor. Likewise, the modified input signal 633 is compared with the digitized carrier signals 647 by the intercept predictor 651 to determine where signals 633 and digitized carrier signals 647 will intercept one another. Data indicating an intercept between signals 633 and 643 is provided to pulse generator 653 to generate interleaved PWM pulses 610.

Data indicating an intercept between signals 633 and 647 may be used in a number of different manners to achieve the desired feedback effects. For example, the intercept data may be provided to the input of a pulse generator 655 to generate interleaved PWM pulses 657 to the input of the combiner circuit 620. Alternatively, the digital output of intercept predictor 651 may be fed directly to the feedback processor 650. Still further, intermediate processing of the output of the intercept predictor 651, pulse generator 655, and/or combiner circuit 620 may be employed to, for example, perform any $N_N$ to $N_L$ ratio matching that may be desired.

Many of the components of amplifier 600 may be integrated with one another, for example, on a common integrated circuit substrate. For example, many of the components of modulator section 603 may be implemented by a digital signal processor and corresponding software. Similarly, if the modulator and feedback components of any of the foregoing amplifier systems are implemented in the analog domain, they may be efficiently implemented on a common integrated circuit substrate.

Figure 7:
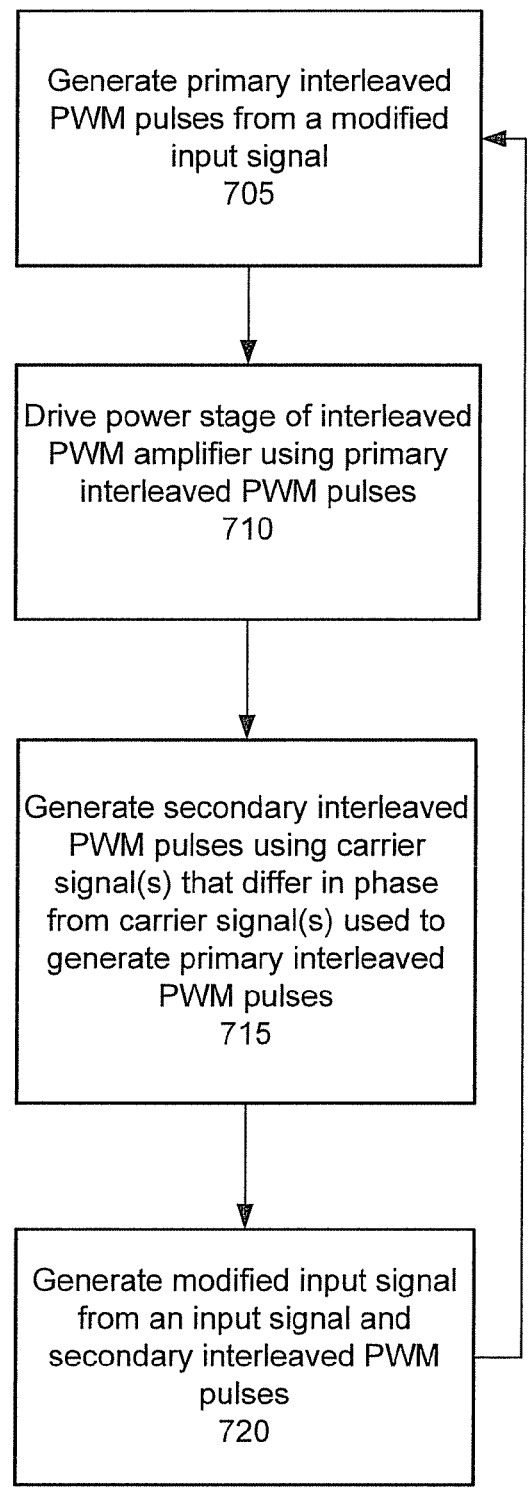
FIG. 7 illustrates a number of interrelated operations that may be used to implement one or more of the amplifier systems shown in FIGS. 3 through 6.

FIG. 7 illustrates a number of interrelated operations that may be used to implement one or more of the foregoing amplifiers. As shown, primary interleaved PWM pulses are generated from a modified input signal at block 705. At block 710, the primary interleaved PWM pulses are used to drive the power stage of an interleaved PWM amplifier. Secondary interleaved PWM pulses are generated at block 715. The secondary interleaved pulses are generated using one or more carrier signals that differ in phase from the carrier signal(s) used to generate the primary interleaved PWM pulses at block 705. At block 720, the modified input signal used at block 705 is generated from an input signal and both the primary and the secondary interleaved PWM pulses.

Figure 8:
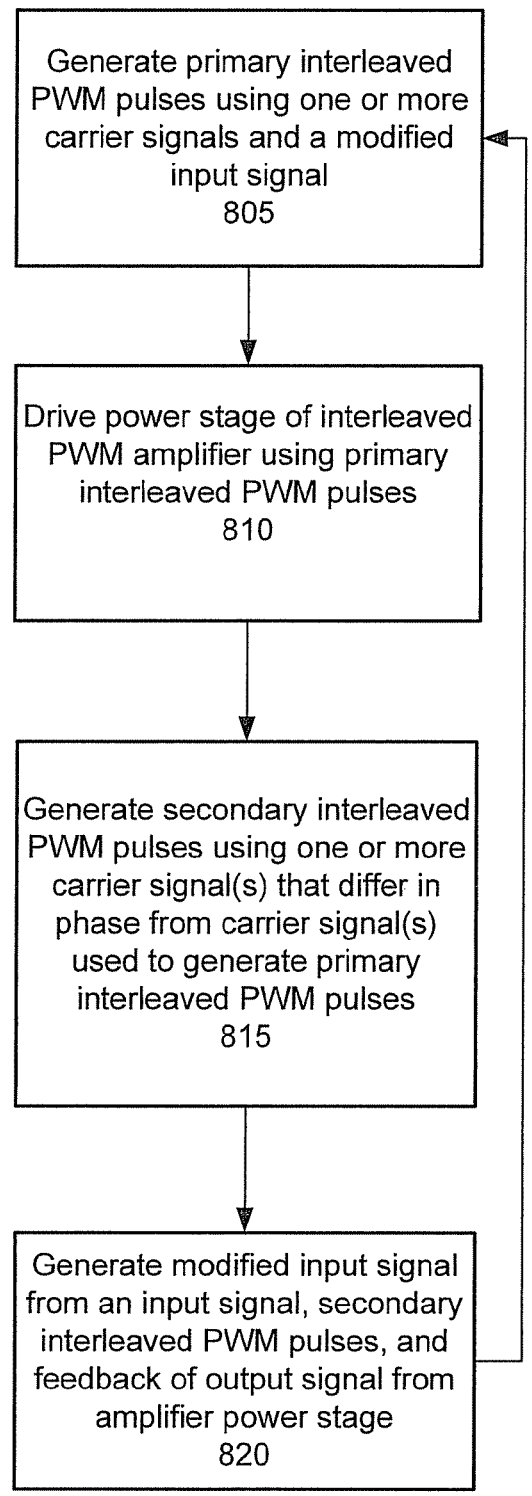
FIG. 8 illustrates a number of interrelated operations that may be used to implement one or more of the amplifier systems shown in FIGS. 3 through 6, where the output signal of the amplifier power stage is used in addition to the interleaved PWM feedback signal to generate the modified input signal to the interleaved PWM amplifier.

FIG. 8 illustrates a further set of interrelated operations that may be used to implement one or more of the foregoing amplifiers. As shown, primary interleaved PWM pulses are generated from a modified input signal at block 805. At block 810, the primary interleaved PWM pulses are used to drive the power stage of an interleaved PWM amplifier. Secondary interleaved PWM pulses are generated at block 815. The secondary interleaved pulses are generated using one or more carrier signals that differ in phase from the carrier signal(s) used to generate the primary interleaved PWM pulses at block 805. At block 820, the modified input signal used at block 805 is generated by combining an input signal, the secondary interleaved PWM pulses, and at feedback signal corresponding to the output signal from the power stage of the amplifier to, for example, a load.

Figure 9:
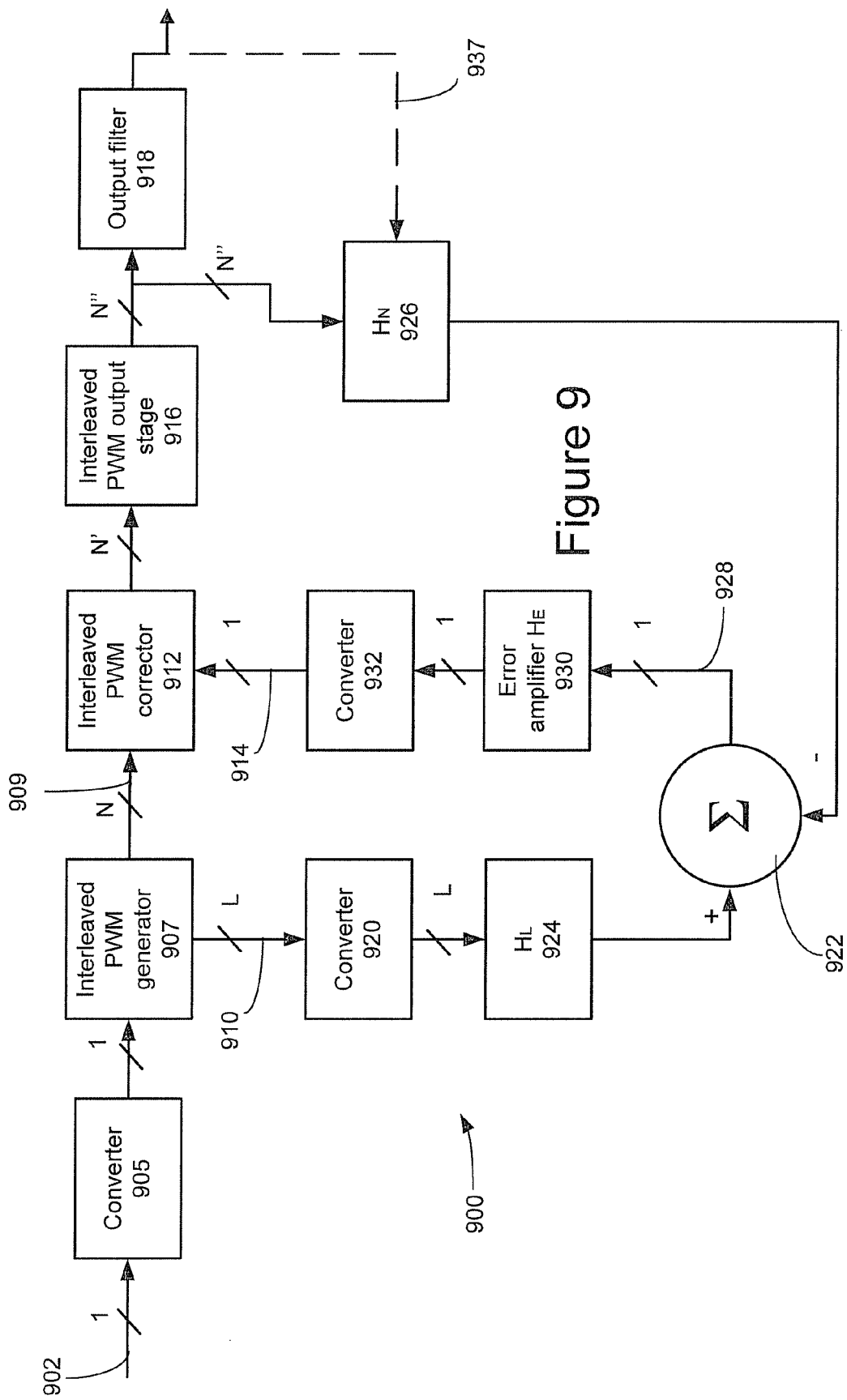
FIG. 9 is a block diagram of a further amplifier system that employs interleaved PWM signals for PWM ripple suppression.

Another amplifier system 900 that employs interleaved PWM signals for PWM ripple suppression is illustrated in FIG. 9. The system 900 may be implemented in the analog domain, the digital domain, or combination of both. In this example, a signal 902 that is to be amplified by system 900 is provided at the input of a converter 905. The output of the converter 905 is provided to the input of an interleaved PWM generator 907. When interleaved PWM generator 907 is implemented as a digital circuit, converter 905 may be in analog-to-digital converter having the full resolution and linearity of the entire signal path through the amplifier system 900. In an analog implementation, converter 905 may be implemented as a gain stage that adapts to the prevailing input levels in filters the incoming signal to prevent aliasing with the PWM modulation process.

The interleaved PWM generator 907 provides primary and secondary sets of interleaved PWM pulses in response to the signal provided from converter 905. The primary set of interleaved PWM pulses are provided at lines 909 and have an interleave order of N. The secondary set of interleaved PWM pulses are provided at lines 910 and have an interleave order of L. The interleaved PWM pulses of the primary set are generated by interleaved PWM generator 907 using carrier signals that differ in phase from the carrier signals used to generate the interleaved PWM pulses of the secondary set. In this example, interleave order N=L and N>1.

The primary set of interleaved PWM pulses are provided to the input of an interleaved PWM corrector 912. The PWM corrector 912 adjusts the pulse widths of the primary set of interleaved PWM pulses in response to one or more correction signals provided at line(s) 914 to generate corrected PWM drive signals N'. The corrected PWM drive signals N', in turn, are used to drive the output switching transistors of an interleaved PWM output stage 916. PWM modulated signals N" are provided from the output of interleaved PWM output stage 916 through output filter 918 for supply to a load, such as a speaker.

The correction signal(s) at line(s) 914 is derived from one or more feedforward signals corresponding to the secondary set of interleaved PWM pulses at lines 910. Additionally, the correction signal(s) may be derived from one or more feedback signals corresponding to the PWM modulated signals N" provided from the output of the interleaved PWM output stage 916. System 900 employs both feedforward and feedback circuit paths to facilitate derivation of the correction signal(s) from both the secondary set of interleaved PWM pulses and the PWM modulated signals N". To this end, the secondary set of interleaved PWM pulses at lines 910 are provided to the input of converter 920. Converter 920 provides a PWM waveform of appropriate response and amplitude to combine with a scaled version of the PWM modulated signals N". In a digital implementation, converter 920 converts a digital code to an analog pulse waveform of related width. In an analog implementation, converter 920 may perform signal scaling of the pulses at lines 910. The output of converter 920 may be provided to a positive terminal of a summing circuit 922 through a gain stage 924 having a transfer function $H_L$. The transfer function $H_L$ may correspond to an attenuation and/or filtering operation that is designed to ensure that a proper relationship exists between the secondary set of interleaved PWM pulses and the PWM modulated signals N". It will be recognized, however, that any conversion, gain, and/or filtering operations may be executed in a single functional block or divided in a different manner between multiple functional blocks. Consequently, components used in the feedforward path of system 900 merely illustrate one manner in which such operations may be implemented.

The PWM modulated signals N" may be provided to the input of a negative terminal of summing circuit 922 through a gain stage 926. In this example, gain stage 926 has a transfer function $H_N$. The transfer function $H_N$ may correspond to an attenuation and/or filtering operation that is designed to ensure that a proper relationship exists between the PWM modulated signals N" and the secondary set of interleaved PWM pulses.

The summing circuit 922 subtracts the signal at the output of the gain stage 926 from the output of the gain stage 924 to generate one or more error signals 928. The error signal(s) is a measure of the error between the ideal PWM signal output provided from the interleaved PWM generator 907 and the PWM modulated signals N" provided at the output of the interleaved PWM output stage 916. The error signal(s) 928 is amplified by an error amplifier 930 having a transfer function HE and optionally converted to an appropriate form by converter 932 for provision to the interleaved PWM corrector 912. If the interleaved PWM corrector 912 is implemented as a digital circuit, then converter 932 may comprise an analog-to-digital converter that converts the analog output from the error amplifier 932 an appropriate digital format for input to the interleaved PWM corrector 912. The conversion time of such an analog-two-digital converter may be selected so that it is very fast so as to avoid adding large amounts of phase lag to the feedback loop. Additionally, the dynamic range of such a converter also may be large. While the magnitude of the error signal should be smaller than the magnitude of the main signal, the errors that result from unregulated power supplies are quite large. The transfer function HE of the error amplifier 930 cascaded with the gain of the interleaved PWM output stage 916 and transfer function $H_N$ should be selected to meet the Nyquist stability criteria.

The secondary set of interleaved PWM signals 910 may be delayed with respect to the primary set of interleaved PWM signals 909 that are generated by the interleaved PWM generator 907. If N=L, then the secondary set of interleaved PWM signals 910 may constitute a delayed version of the primary set of interleaved PWM pulses. This delay may be introduced, for example, by converter 920, gain stage 924, and/or using a separate delay circuit. The magnitude of the delay may be selected to correspond to the expected signal delay through the interleaved PWM output stage 916. The primary set of interleaved PWM pulses may be expected to be phased to evenly divide a unit circle. Thus, the secondary set of interleaved PWM pulses, used as reference signals, also may be phased phase to evenly divide the unit circle, just slightly lagging in phase to the primary set of interleaved PWM pulses.

The error amplifier 930 may be implemented in a manner that facilitates creation of a conditionally stable feedback system having a high order of integration. To this end, the error amplifier 930 may be implemented using a high order passive RC differentiator for the feedback around one high gain inverting amplifier. An active clamp may be used around this feedback network to suppress out-of-control outputs that occur during system overload.

Gain stages 924 and 926 may combine their interleaved inputs internally or pass them to their outputs for summing. Thus there are no signal counts shown in FIG. 9 on the outputs for either stage. Both forms are logically equivalent in a linear network. Both signal paths may have the same relative amplitude and phase response to allow them to produce a zero difference when the interleaved PWM output stage 916 is errorless.

The gain stage 926 also may receive low-pass filtered inputs 937 from the output filter 918. This may be done readily using high-order remote sensing methods where the high-frequency signal path comes from the interleaved PWM output stage 916 and the low-frequency signal path comes from the output filter 918.

Figure 10:
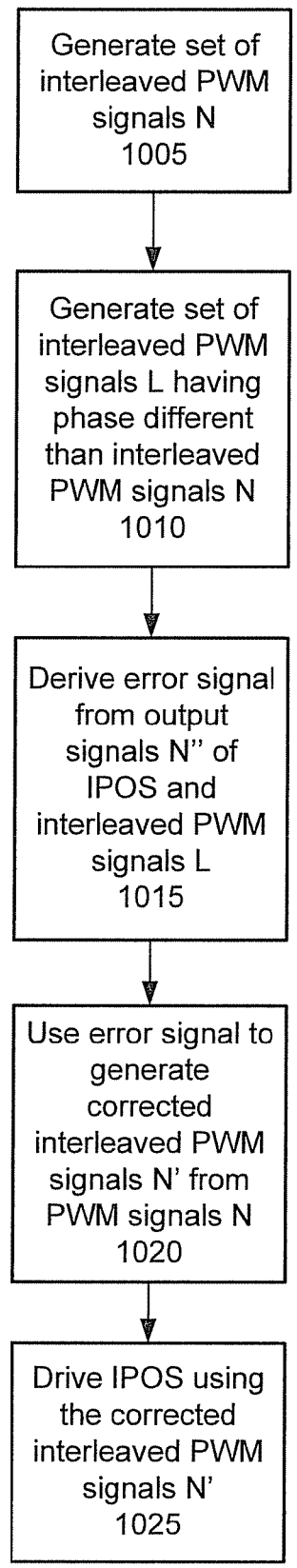
FIG. 10 illustrates a number of interrelated operations that may be used to implement the amplifier system shown in FIG. 9.

FIG. 10 is a flow chart showing a number of interelated operations that may be executed in a system employing interleaved PWM signals for PWM ripple suppression. As shown, a first set of N interleaved PWM signals are generated at block 1005 and a second set of L interleaved PWM signals are generated at block 1010. The operations shown at blocks 1005 and 1010 may be executed concurrently. The first set of interleaved PWM signals at block 1005 are generated by modulating carrier signals numbering N with a signal that is to be amplified, and the second set of interleaved PWM signals at block 1010 are generated by modulating carrier signals numbering L with the signal that is to be amplified. The carrier signals used to generate the first set of interleaved PWM signals may differ in phase from the carrier signals used to generate the second set of interleaved PWM signals.

At block 1015, an error signal is generated. In this example, the error signal is derived from the output signals of the interleaved PWM output stage and the second set of interleaved PWM signals that are generated at block 1010. This error signal is used at block 1020 to correct the pulse widths of the first interleaved PWM signals. The corrected interleaved PWM signals, in turn, are used to drive the interleaved PWM output stage of the amplifier at block 1025.

While various embodiments of the invention have been described, it will be apparent to those of ordinary skill in the art that many more embodiments and implementations are possible within the scope of the invention. For example, there are many embodiments of delay generators and how they may be modulated or bypassed. Accordingly, the invention is not to be restricted except in light of the attached claims and their equivalents.

I claim:

1. An amplifier comprising:
   an interleaved amplifier section receiving a modified input signal and providing an amplified output signal, where the interleaved amplifier section has a transfer characteristic $G_N$ corresponding to a first set of one or more phasing vectors;
   an interleaved PWM section receiving the modified input signal and providing an interleaved pulse output signal, where the interleaved PWM section has a transfer characteristic $G_L$ corresponding to a second set of one or more phasing vectors that are different from the first set of one or more phasing vectors;
   a combiner circuit;
   a feedback circuit disposed to feedback at least a portion of the amplified output signal of the interleaved amplifier section to the summer circuit, where the further feedback circuit has a transfer characteristic $H_N$;
   a further feedback circuit disposed to feedback at least a portion of the interleaved pulse output signal of the interleaved PWM section to the summer circuit, where the feedback circuit has a transfer characteristic $H_L$; and
   where the combiner circuit generates the modified input signal by subtracting the output signal of the feedback circuit and the output signal of the further feedback circuit from an input signal that is to be amplified.

2. An amplifier as claimed in claim 1, where $G_L \cdot H_L$ is nominally proportional to $G_N \cdot H_N$ over at least a predetermined portion of an output bandwidth of the amplifier.

3. An amplifier as claimed in claim 2, where transfer characteristic $G_N$ corresponds to an interleave order of $N_N$ and transfer characteristic $G_L$ corresponds to an interleave order of $N_L$, and where the proportionality of $G_L \cdot H_L$ to $G_N \cdot H_N$ is about $N_L$ to $N_N$.

4. An amplifier as claimed in claim 1, where the first set of one or more phasing vectors are disposed at angles with one another to equally divide a circle.

5. An amplifier as claimed in claim 1, where the second set of one or more phasing vectors are disposed at angles with one another to equally divide a circle.

6. An amplifier as claimed in claim 4, where the second set of one or more phasing vectors equally divide a circle at angles offset from the first set of one or more phasing vectors.

7. An amplifier as claimed in claim 4, where the first and second set of one or more phasing vectors combine to equally divide the circle.

8. A method for operating an amplifier, the method comprising:
generating primary interleaved PWM pulses in response to a modified input signal and one or more carrier signals;
driving a power stage using the primary interleaved PWM pulses;
generating secondary interleaved PWM pulse signals in response to the modified input signal and one or more further carrier signals; and
generating the modified input signal from an input signal and the secondary interleaved PWM pulses.

9. A method for operating an amplifier as claimed in claim 8, where the one or more further carrier signals used to generate the secondary interleaved PWM pulse signals differ in phase from the one or more carrier signals used to generate the primary interleaved PWM pulse signals.

10. A method for operating an amplifier as claimed in claim 8, where the one or more carrier signals used to generate the primary interleaved PWM pulses have corresponding phasing vectors that are equal in magnitude and that equally divide a unit circle.

11. A method for operating an amplifier as claimed in claim 8, where the one or more further carrier signals used to generate the secondary interleaved PWM pulses have corresponding phasing vectors that are equal in magnitude and that equally divide a unit circle.

12. A method for operating an amplifier as claimed in claim 11, where the one or more further carrier signals used to generate the secondary interleaved PWM pulses have corresponding phasing vectors that are equal in magnitude and that equally divide a unit circle at an angle offset to the one or more carrier signals used to generate the primary interleaved PWM pulses.

13. A method for operating an amplifier as claimed in claim 11, where the one or more carrier signals and the one or more further carrier have corresponding phasing vectors that equally divide a unit circle.

14. An amplifier comprising:
an interleaved amplifier section configured to receive a modified input signal and provide an amplified output signal, where the interleaved amplifier section has a transfer characteristic $G_N$ corresponding to one or more first phasing vectors;
an interleaved PWM section configured to receive the modified input signal and provide an interleaved pulse output signal, where the interleaved PWM section has a transfer characteristic $G_L$ corresponding to one or more second phasing vectors; and
one or more combiner circuits configured to generate the modified input signal based on the amplified output signal, the interleaved pulse output signal, and an input signal that corresponds to a signal that is to be amplified.

15. An amplifier as claimed in claim 14, where the amplified output signal is generated using one or more first carrier signals, and the interleaved pulse output signal is generated using one or more second carrier signals.

16. An amplifier as claimed in claim 15, where the one or more first carrier signals differ in phase from the one or more second carrier signals.

17. An amplifier as claimed in claim 15, where the one or more first carrier signals used by the interleaved amplifier section correspond to the one or more first phasing vectors, and where the one or more first phasing vectors comprises a plurality of first phasing vectors disposed at angles with one another to equally divide a circle.

18. An amplifier as claimed in claim 15, where the one or more second carrier signals used by the interleaved PWM section correspond to the one or more second phasing vectors, and where the one or more second phasing vectors comprises a plurality of second phasing vectors disposed at angles with one another to equally divide a circle.

19. An amplifier as claimed in claim 14, where the one or more second phasing vectors equally divide a circle at angles offset from the one or more first phasing vectors.

20. An amplifier as claimed in claim 14, where the one or more first and second phasing vectors combine to equally divide a circle.

21. An amplifier as claimed in claim 14, further comprising a signal attenuator disposed to provide an attenuated output signal corresponding to the amplified output signal from the interleaved amplifier section.

22. An amplifier as claimed in claim 21, further comprising a delay circuit disposed to provide a delayed output signal corresponding to the interleaved pulse output signal of the interleaved PWM section.

23. An amplifier as claimed in claim 22, where the one or more combiner circuits is configured to generate the modified input signal based on the delayed output signal instead of the amplified output signal, the attenuated output signal instead of the interleaved pulse output signal, and the input signal that corresponds to the signal that is to be amplified.

24. An amplifier as claimed in claim 23, where the one or more combiner circuits comprises a first combiner circuit generating a feedback signal as a sum of the attenuated output signal and the delayed output signal, and a second combiner circuit subtracting the feedback signal from the input signal.

25. An amplifier as claimed in claim 24, further comprising a processing circuit disposed to process the feedback signal from the first combiner circuit, where the processed feedback signal is provided to the second combiner circuit.

26. An amplifier as claimed in claim 22, where the delay circuit is implemented in the interleaved PWM section and is included in the transfer characteristic $G_L$.

27. An amplifier as claimed in claim 14, where the one or more first phasing vectors are different from the one or more second phasing vectors.

* * * * *

UNITED STATES PATENT AND TRADEMARK OFFICE
CERTIFICATE OF CORRECTION

| | | |
|---|---|---|
| PATENT NO. | : 7,969,126 B2 | Page 1 of 1 |
| APPLICATION NO. | : 12/573701 | |
| DATED | : June 28, 2011 | |
| INVENTOR(S) | : Gerald R. Stanley | |

It is certified that error appears in the above-identified patent and that said Letters Patent is hereby corrected as shown below:

In the Claims

In column 15, line 57, please insert --signals-- after "carrier".

Signed and Sealed this
Twenty-third Day of August, 2011

David J. Kappos
*Director of the United States Patent and Trademark Office*